United States Patent [19]

Fukuzo et al.

[11] Patent Number: 4,695,980

[45] Date of Patent: Sep. 22, 1987

[54] INTEGRATED CIRCUIT HAVING A COMMON INPUT TERMINAL

[75] Inventors: Yukio Fukuzo; Yasukazu Inoue, both of Tokyo, Japan

[73] Assignee: NEC Corporation, Tokyo, Japan

[21] Appl. No.: 753,091

[22] Filed: Jul. 9, 1985

[30] Foreign Application Priority Data

Jul. 9, 1984 [JP] Japan .................................. 59-141803

[51] Int. Cl.$^4$ ................................................ G11C 7/00
[52] U.S. Cl. ...................................... 365/222; 365/189
[58] Field of Search ................. 365/222, 189, 230, 233

[56] References Cited

U.S. PATENT DOCUMENTS

4,562,555 12/1985 Ouchi et al. .................... 365/189 X

Primary Examiner—Joseph A. Popek
Attorney, Agent, or Firm—Sughrue, Mion, Zinn, Macpeak and Seas

[57] ABSTRACT

An improved integrated circuit provided with a reduced capacitance of common external terminal connected to a plurality of circuits is disclosed. A switch is inserted between the external terminal and at least one of the circuits. The switch is controlled in such manner that it is rendered conductive when that circuit is to receive the signal at the external terminal and non-conductive when the circuit is not to receive the signal at the external terminal therein.

8 Claims, 6 Drawing Figures

INTEGRATED CIRCUIT HAVING A COMMON INPUT TERMINAL

BACKGROUND OF THE INVENTION

The present invention relates to an integrated circuit having a common input terminal for a plurality of circuit blocks receiving signals via the common input terminal.

The integration density of integrated circuits has been increasing and the number of elements and functional circuits fabricated in the same integrated circuit chip have become large. On the other hand, the number of external terminals provided in one integrated circuit chip has been limited in view of topographical layout of the chip and yields of production. Under such circumstance, it has been proposed that one external terminal is commonly utilized by two or more circuit blocks included in the same chip. For example, in the multi-strobe type dynamic memory in which row address signals and column signals are taken through the same set of address terminals in response to a row address strobe ($\overline{RAS}$) and a column address strobe ($\overline{CAS}$), respectively, the column address strobe is also used to control refresh operation, data outputting operation and serial column selecting operation. In this case, the column address strobe is applied to the circuit blocks for achieving the above operations. Therefore, the external terminal receiving the column address signal is directly connected to the inputs of the respective circuit blocks.

However, according to the above technique, since the common external terminal is directly connected to a plurality of circuit blocks, the capacitance associated to the common external terminal is inevitably very large, resulting in low speed operations. Moreover, each of the circuit blocks is provided with a special control circuit which prevents the circuit block from being affected by unnecessary input through the common external terminal after conducting it relevant function. This has made the respective circuit blocks complicated.

SUMMARY OF THE INVENTION

It is one object of the present invention to provide an integrated circuit which can operate at high speed.

It is another object of the present invention to provide an integrated circuit of the type having a plurality of circuit blocks sharing the same external terminal, which can be fabricated in highly integrated structure.

The integrated circuit according to the present invention is the type in which an external terminal is connected to a plurality of circuit blocks, and featured in that at least one of the circuit blocks is connected to the external terminal through a transfer gate and the transfer gate is rendered conductive when the at least one circuit block needs to receive the signal supplied at the external terminal and non-conductive when the at least one circuit block does not necessitate the signal at the external terminal.

According to the present invention, the at least one circuit block is selectively isolated from the external terminal and hence the effective load capacitance associated to the external terminal is significantly reduced. Moreover, since the circuit block is selectively isolated from the external terminal and the circuit block is no more sensitive to the signal at the external terminal in this instance, the signal at the external terminal does not adversely affect the circuit block.

DETAILED DESCRIPTION OF THE INVENTION

Figure 1:
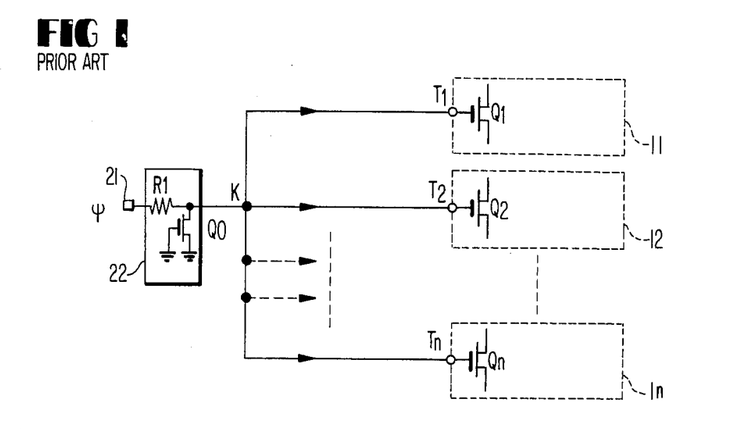
FIG. 1 is a schematic block diagram showing an integrated circuit according to the prior art.

Referring to FIG. 1, an integrated circuit according to the prior art is briefly explained.

A plurality of circuit blocks 11 to $1n$ are provided in an integrated circuit. The circuit blocks 11 to $1n$ have different functions and include input transistors $Q_1$ to $Q_n$. To the gates of the input transistors $Q_1$ to $Q_n$ an external terminal 21 receiving a signal $\Psi$ is commonly connected via an input protecting circuit 22 composed of a resistor $R_1$ and a transistor $Q_0$. Each of the circuit blocks 11 to $1n$ is adapted to be controlled by the logic pattern of the signal $\Psi$ solely or with other signals such as $\phi_0$. For example, the circuit block 11 is enabled in response to a high level of the signal $\Psi$ while the circuit block 12 is enabled in response to a low level when the signal $\phi_0$ is at high. Thus, the signal $\Psi$ controls the respective circuit blocks in their own ways.

However, according to the prior art, the signal $\Psi$ is always applied to the inputs $T_1$ to $T_n$ of the circuit blocks even when some of the circuit blocks do not need the signal $\Psi$ temporarily. Thus, the capacitance associated to a node K to which the output end of the input protecting circuit 22 is very large. Therefore, the propagation time of the signal $\Psi$ from the terminal 21 to the respective inputs $T_1$ to $T_n$ of the circuit blocks is very large. This means that effective operation speeds of the respective circuit blocks are slow.

Moreover, in order to drive the large capacitance associated to the node K, the signal $\Psi$ is required to have small internal impedance. Namely, the generator (not shown) of the signal $\Psi$ must have the large driving capability.

Furthermore, since the signal $\Psi$ is always applied to the respective circuit blocks, each of the circuit blocks has to be provided with circuit means for rendering the internal circuit (not shown) included therein insensitive to the operation of the input transistor when the circuit block do not need the signal $\Psi$. Thus, the circuit structures of the circuit blocks have become complicated.

Figure 2:
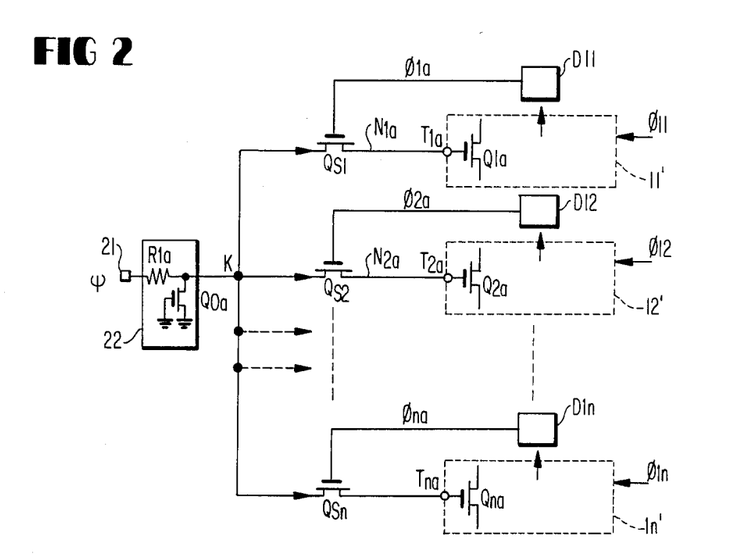
FIG. 2 is a schematic block diagram showing one embodiment of the present invention.

Referring to FIG. 2, the integrated circuit according to the present invention is described.

Inputs $T_{1a}$ to $T_{na}$ of the circuit blocks $11'$ to $1n'$ are connected to the output node K of the input protecting circuit 22 via transfer gate transistors $Q_{s1}$ to $Q_{sn}$, respectively, as illustrated. The transfer gate transistors $Q_{s1}$ to $Q_{sn}$ are controlled by control signals $\phi_{1A}$ to $\phi_{na}$. The signals $\phi_{1a}$ to $\phi_{na}$ are generated by detection circuits $D_{11}$ to $D_{1n}$ provided for the circuit blocks $11'$ to $1n'$, respectively. The detection circuit $D_{11}$ monitors the operating state of the circuit block $11'$ and sets the control signal $\phi_{1a}$ at high level to render the transistor $Q_{s1}$ conductive when the circuit block needs to take the signal $\Psi$ therein while the detection circuit $D_{11}$ sets the control signal $\phi_{1a}$ at low level to render the transistor $Q_{s1}$ non-conductive when the circuit block 11' does not need to receive the signal $\Psi$. Other detection circuits $D_{12}$ to $D_{1n}$ control the transfer gate transistors $Q_{s2}$ to $Q_{sn}$ in response to the states of the circuit blocks 12' to 1n', respectively in the same manner.

Figure 3:
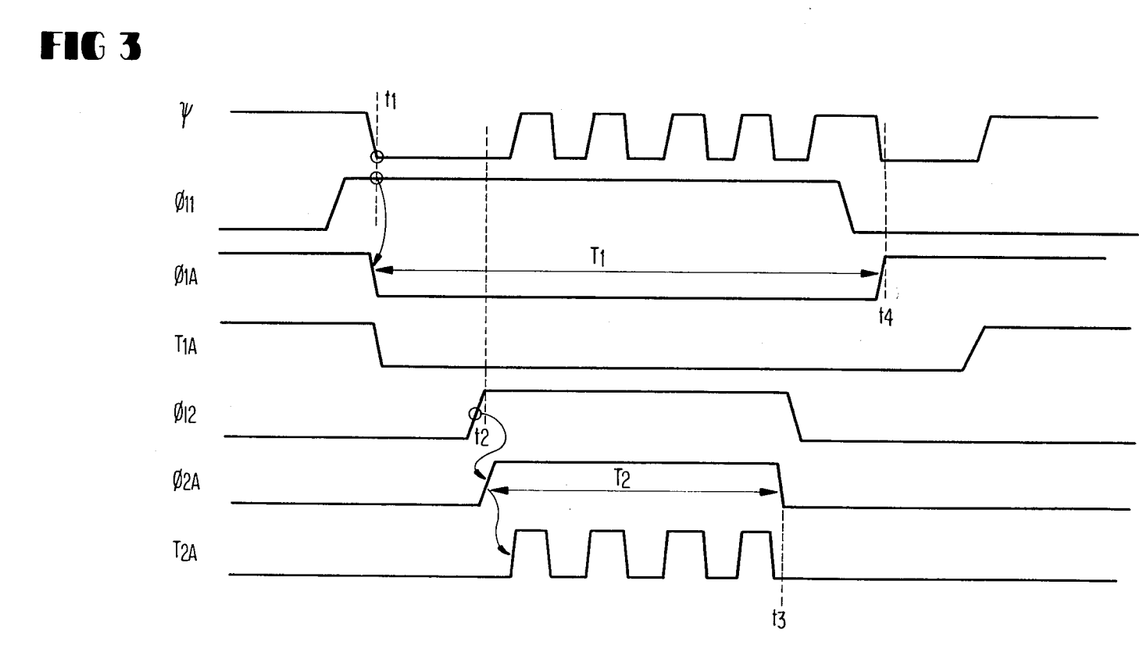
FIG. 3 is a diagram showing waveforms in the circuit of FIG. 2.

One example of operation of the circuit shown in FIG. 2 is explained with reference to FIG. 3. In the following, by way of example, the explanation is made on the circuit blocks 11' and 1n'.

At a time point $t_1$, the signal $\Psi$ changes from high level to low level while a clock signal $0_{11}$ applied to the circuit block 11' is high. In response to these states of the signals, the circuit block 11' starts its operation such as storing data or the like over the subsequent period $T_1$ without necessitating the signal $\Psi$. Therefore, the detection circuit $D_{11}$ produces a low level of the signal $\phi_{1a}$ thereby to render the transistor $Q_{s1}$ non-conductive so that the input $T_{1a}$ is kept low during the period $T_1$. While, a clock signal $\phi_{12}$ applied to the circuit block 12' changes from low level to high level so that the circuit block 12' enters into its operating mode over the subsequent period $T_2$. During this period $T_2$, the detection circuit $D_{12}$ sets the control signal $\phi_{2a}$ high so that the transfer gate transistor $Q_{s2}$ is rendered conductive. Accordingly, the signal $\Psi$ is transmitted to the input $T_{2a}$ of the circuit block 12' during this period $T_2$. Thus, the circuit block 12' takes the signal $\Psi$ in and performs operations based on the signal $\Psi$ during the period $T_2$. While, the waveform of the signal $\Psi$ during the period does not affect the circuit block 11' because the transfer gate transistor $Q_{s1}$ is not conducting. Thus, the signal $\Psi$ is rapidly transmitted to the input $T_{2a}$ during the period $T_2$. At a time point $t_3$, the clock signal $\phi_{12}$ changes from high level to low level so that the circuit block 12' enters into non-operating state. Then, in response to this, the detection circuit $D_{12}$ changes the control signal $\phi_{2a}$ from high level to low level thereby to isolate the input $T_{2a}$ of the circuit block 12' from the input terminal 22. Then, at a time point $t_4$, the signal $\Psi$ changes from low level to high level under the low level of the clock signal $\phi_{11}$. Then, in response to this, the detection circuit $D_{11}$ sets the signal $\phi_{1a}$ high level to render the transfer gate transistor $Q_{s1}$ conductive.

Thus, the circuit block 11' is rendered responsive to the signal.

As described above, the signal $\Psi$ is transmitted only to the circuit block or blocks which necessitate to take the signal $\Psi$ therein, and hence the load capacitance associated to the terminal for receiving the signal $\Psi$ is remarkably reduced.

Figure 4:
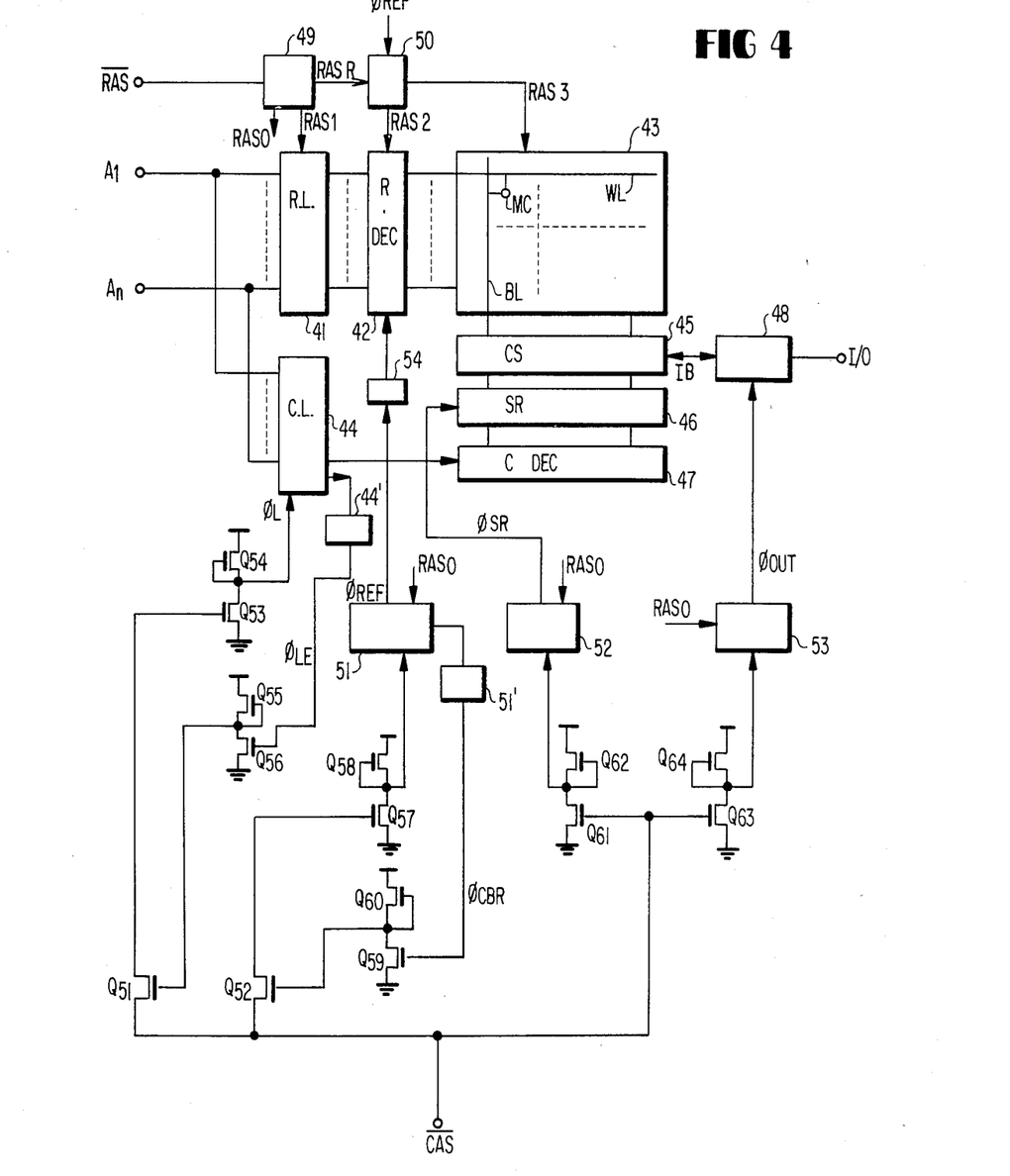
FIG. 4 is a schematic block diagram of another embodiment of the present invention.
Figure 5:
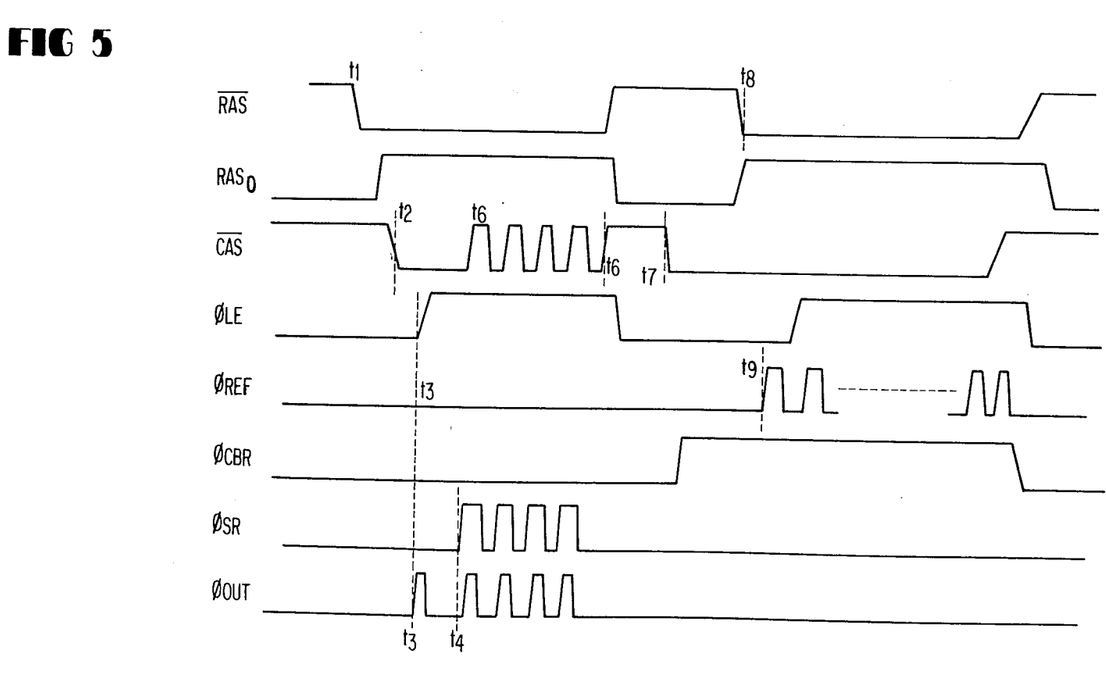
FIG. 5 is a diagram showing waveforms of the circuit of FIG. 4.

Referring to FIGS. 4 and 5, a detailed embodiment of the present invention is described. This embodiment is the case where the present invention is applied to the multi-strobe type dynamic RAM.

FIG. 4 shows a block diagram of the multi-strobe type RAM to which the present invention is applied.

A memory cell array 43 includes a plurality of dynamic type memory cells MC each coupled to one of word lines WL and one of bit lines BL and sense amplifiers (not shown). A row address signal latch circuit 41 is connected to a set of address input terminals $A_1$ to $A_n$ and latches the signals at the terminals $A_1$ to $A_n$ in response to a control signals RAS1 which is generated by a first row timing signal generator 49 receiving a row address strobe $\overline{RAS}$. A row decoder 42 is coupled to the word lines and selects one of them in response to a control signal RAS2 which is generated by a second row timing signal generator 50. A timing signal RAS3 enables the sense amplifiers in the array. The respective bit lines BL are inputted to a column selection circuit 45 and the selection circuit 45 selectively connects the bit lines BL to a bus line IB which is coupled to an input-/output circuit 48. The selection circuit 45 is controlled by a shift register 46 whose initial state is determined by a column address decoder 47. The shift register 46 performs shift operations in response to a series of shift pulses $\phi_{SR}$ generated by a nibble mode control circuit 52. The column decoder 47 receives the row address signals latched by a row address latch circuit 44. An internal refresh control circuit 51 introduces self refreshing operation into the memory when the $\overline{CAS}$ is first changed to low level and thereafter the $\overline{RAS}$ is changed to low level. The internal refresh control circuit 51 produces a chain of refresh pulses $\phi_{REF}$ which are applied to a refresh address counter 54 and the second timing signal generator 50. When the memory is in the self-refreshing mode, the address counter 54 provides the row decoder 42 with refresh address signal and the generator 50 generates the signals RAS2 and RAS3 in response to $\phi_{REF}$. A control circuit 53 produces a control signal $\phi_{OUT}$ for enabling the circuit 48. In this arrangement, the $\overline{CAS}$ is applied to the column latch circuit 44 via a transfer gate transistor $Q_{52}$ and an inverter composed of transistors $Q_{53}$ and $Q_{54}$. Also, the $\overline{CAS}$ is applied to the refresh control circuit 51 via a transfer gate transistor $Q_{52}$ and an inverter composed of transistors $Q_{57}$ and $Q_{58}$. While, the $\overline{CAS}$ is applied to the control circuits 52 and 53 via an inverter composed of transistors $Q_{61}$ and $Q_{62}$, and an inverter composed of transistors $Q_{63}$ and $Q_{64}$, respectively. The transfer gate transistor $Q_{51}$ is located at the location close to the terminal $\overline{CAS}$ and the transfer gate transistor $Q_{52}$ is also located at the location close to the $\overline{CAS}$ terminal. Thus, the major wiring capacitance associated to the wiring connected to the gate of the transistor $Q_{53}$ and the major capacitance associated to the wiring connected to the gate of the transistor $Q_{57}$ are left behind the transfer gate transistors $Q_{51}$ and $Q_{52}$, respectively. Accordingly, such major capacitances can be operatively isolated from the $\overline{CAS}$ terminal. The transfer gate transistors $Q_{51}$ is controlled by a latch completion detection circuit 44 and an inverter composed of the transistors $Q_{55}$ and $Q_{56}$. The circuit 44 generates a latch completion signal $\phi_{LE}$ when the latch circuit 44 completes its latching operation of column address signals.

Figure 6:
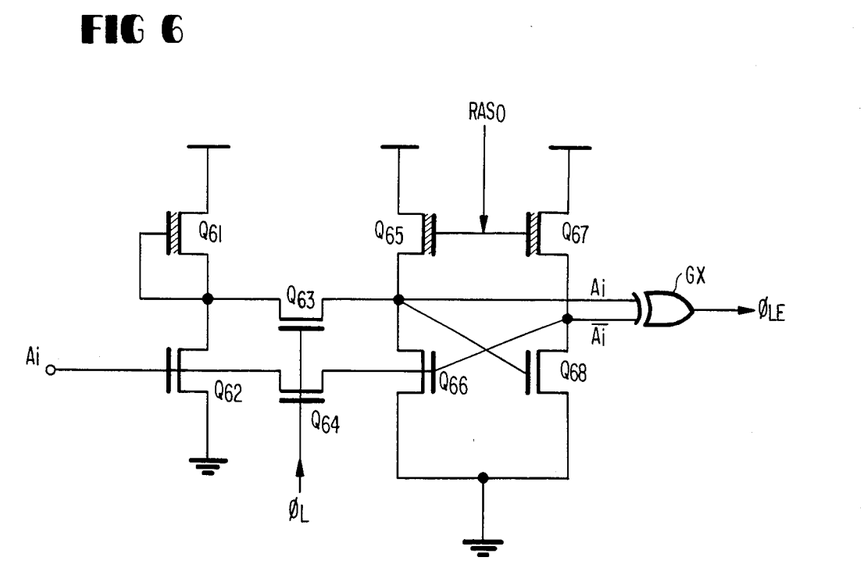
FIG. 6 is a circuit diagram showing one example of the circuit 52 in FIG. 4.

One example of the detection circuit 44' is shown in FIG. 6. In FIG. 6, one-bit structure of the column latch circuit 44 is shown. An address terminal Ai is inputted to an inverter composed of transistors $Q_{61}$ and $Q_{61}$. Transistors $Q_{65}$ to $Q_{68}$ form a clocked type flip-flop circuit for holding the column address signal. The transistors $Q_{65}$ and $Q_{67}$ are of a depletion type and serve as gated-load in response to the signal RAS0. Transfer gate transistors $Q_{63}$ and $Q_{64}$ transmit true and complementary signals of Ai to the flip-flop in response to a signal $\phi_L$ generated by inverting $\overline{CAS}$ by the inverters of $Q_{53}$ and $Q_{54}$. Here, an exclusive OR gate CX having inputs receiving true and complementary signals Ai and $\overline{Ai}$ is provided. The gate GX detects that the flip-flop completes its latching operation of Ai and $\overline{Ai}$. Thus, the transfer gate transistor $Q_{51}$ is rendered conductive before the latching of the column address signals and non-conductive after the latching of the column address signals. The transfer gate transistor $Q_{52}$ is controlled by an output of an inverter composed of $Q_{58}$ and $Q_{57}$ receiving a signal $\phi_{CBR}$ which is generated by a refresh detection circuit 51' when the operation of the memory entered into the self-refreshing mode.

FIG. 5 shows waveforms showing operations of the memory of FIG. 4.

At time point $t_1$, $\overline{RAS}$ changes from high level to low level. In response to this change of $\overline{RAS}$, the signal RAS0 applied to the circuits 51 and 52 changes from low level to high level. Then, $\overline{CAS}$ changes high level to low level at time point $t_2$ so that the column latch circuit commences latch operation. In this instance, $\overline{CAS}$ is applied to the circuit 44 via the conductive transfer gate $Q_{51}$ because $\phi_{LE}$ is at low. Then at time point $t_3$, the signal $\phi_{LE}$ becomes high to render the transistor $Q_{51}$ non-conductive and the signal $\phi_{OUT}$ is once activated to achieve a first access operation. Then, $\overline{CAS}$ is repeatedly changed between high and low levels from time point $t_4$ so that the memory into the nibble mode in which the signals $\phi_{SR}$ and $\phi_{OUT}$ are repeatedly generated in synchronism with the change of $\overline{CAS}$. Thus, data at a plurality of bit lines are sequentially accessed by the shift register 46. Thus, the nibble mode operation is achieved.

Then, operation is changed to the self-refreshing operation. Namely, $\overline{CAS}$ is changed from high level to low level at time point $t_7$ when $\overline{RAS}$ is at high. In response to this, the control circuit 51 introduces the self-refreshing mode into the memory and generates a high level of $\phi_{LE}$ to render the transistor $Q_{52}$ non-conductive. Then, in response to change of $\overline{RAS}$ to low level, the refresh clock $\phi_{REF}$ is repeatedly generated to achieve self-refresh operations.

As has been described above, by way of examples, the present invention is advantageous in reduction of the load capacitance associated to a common external terminal.

We claim:

1. An integrated circuit comprising:
   a common external terminal;
   a first circuit for receiving a first control signal;
   a second circuit for receiving a second control signal;
   a first switch coupled between said common external terminal and said first circuit;
   a second switch coupled between said common external terminal and said second circuit;
   a first detection circuit coupled to said first circuit for generating a first detection signal when said first circuit assumes a first state;
   a first control circuit responsive to said first detection signal for rendering said first switch conductive to allow said first circuit to receive a signal applied to said common external terminal;
   a second detection circuit coupled to said second circuit for generating a second detection signal when said second circuit assumes a second state; and
   a second control circuit responsive to said second detection signal for rendering said second switch non-conductive to isolate said second circuit from said common external terminal.

2. The circuit according to claim 1, in which said first state of said first circuit is determined by said first control signal.

3. The circuit according to claim 1, in which said second state of said second circuit is determined by said second control signal and a signal applied at said common external terminal.

4. The circuit according to claim 1, in which said first switch includes a field effect transistor having a drain-source current path coupled between said common external terminal and said first circuit.

5. The circuit according to claim 1, in which said second switch includes a field effect transistor having a drain-source current path coupled between said second circuit and said common external terminal.

6. An integrated circuit comprising:
   a memory array of memory cells arranged in rows and columns;
   a first terminal for receiving a first control signal;
   a second terminal for receiving a second control signal;
   first means responsive to said first control signal received by said first terminal for storing row address signals;
   second means coupled to said first means and said memory array for selecting one of the rows of said memory array in response to the row address signals stored by said first means;
   third means for storing column address signals when said second control signal is received by said second terminal and said first control signal is applied to said first terminal;
   fourth means coupled to said third means for generating a latch completion signal when said column address signals are stored in said third means;
   a first switch coupled between said second terminal and a control input of said third means;
   fifth means for rendering said first switch non-conductive when said latch completion signal is present and conductive otherwise;
   sixth means for generating an internal refresh signal when said first control signal is applied to said first terminal and said second control signal is applied to said second terminal;
   seventh means for designating a row of said memory array to be refreshed in response to said internal refresh signal irrespective of said row address signals;
   a second switch coupled between said second terminal and said sixth means; and
   eighth means for rendering said second switch non-conductive when said internal refresh signal is present and conductive otherwise.

7. The integrated circuit according to claim 6, further comprising a shift register for selecting the columns of said memory array, and a shift control circuit coupled to said second terminal for controlling operation of said shift register 8. An integrated circuit comprising:
   a common terminal;
   a plurality of circuits each having an input terminal operatively connected to said common terminal;
   at least one transfer gato provided between said common terminal and the input terminal of at least one of said circuits, said at least one of said circuits receiving a control signal and assuming a first mode in which a state of said at least one of said circuits is determined only by said control signal and a second mode in which a state of said at least one of said circuits is determined by said control signal and a signal applied to said common terminal;

a detection circuit for generating a first signal when said at least one of said circuits is to be changed from said first mode to said second mode and a second signal when said at least one of said circuits is to be changed from said second mode to said first mode; and a control circuit for rendering said at least one transfer gate conductive in response to said first signal and rendering said at least one transfer gate nonconductive in response to said second signal.

* * * * *

UNITED STATES PATENT AND TRADEMARK OFFICE
CERTIFICATE OF CORRECTION

PATENT NO.   : 4,695,980
DATED        : September 22, 1987
INVENTOR(S)  : FUKUZO ET AL It is certified that error appears in the above-identified patent and that said Letters Patent is hereby corrected as shown below:

COLUMN 4, LINE 63    After "exclusive OR gate" delete "CX" insert --GX--

COLUMN 6, LINE 59    After "transfer" delete "gato" insert --gate--

Signed and Sealed this

Nineteenth Day of July, 1988

Attest:

DONALD J. QUIGG

*Attesting Officer*    *Commissioner of Patents and Trademarks*